United States Patent [19]

Minetti et al.

[11] 3,969,813

[45] July 20, 1976

[54] METHOD AND APPARATUS FOR REMOVAL OF SEMICONDUCTOR CHIPS FROM HYBRID CIRCUITS

[75] Inventors: Richard Henry Minetti, Allentown, Pa.; Robert Walter Strickland, Clarendon Hills, Ill.

[73] Assignees: Bell Telephone Laboratories, Incorporated, Murray Hill, N.J.; Western Electric Company, New York, N.Y.

[22] Filed: Aug. 15, 1975

[21] Appl. No.: 605,072

[52] U.S. Cl. .................................. 29/575; 29/589; 29/427; 156/344
[51] Int. Cl.² ........................................ B32B 35/00
[58] Field of Search ............ 29/426, 427, 575, 589; 83/177, 53; 228/116; 156/344

[56] References Cited
UNITED STATES PATENTS 3,913,217 10/1975 Misawa et'al. ...................... 156/344
3,915,784 10/1975 Makhijani et al. ................... 156/344

*Primary Examiner*—Edward G. Whitby
*Attorney, Agent, or Firm*—L. H. Birnbaum

[57] ABSTRACT

A method and apparatus are disclosed for removal of defective semiconductor chips from hybrid integrated circuits. The apparatus includes a jet nozzle which directs at least four high pressure water jet streams to the area surrounding the defective chip. The nozzle is also provided with a fixture for sealing off this area from the rest of the circuit by making contact to the encapsulant on the circuit. The jet streams bore through the encapsulant within the area defined by the fixture and are deflected by the ceramic substrate to an area under the chip thereby lifting off the chip. The invention therefore provides relatively fast removal of the defective chips without damaging the ceramic substrates or other components of the circuit.

20 Claims, 5 Drawing Figures

METHOD AND APPARATUS FOR REMOVAL OF SEMICONDUCTOR CHIPS FROM HYBRID CIRCUITS

BACKGROUND OF THE INVENTION

This invention relates to the removal of defective semiconductor chips from hybrid integrated circuits.

As should be expected, present production of hybrid integrated circuits, which combine thin film elements and integrated circuit semiconductor chips on a single ceramic substrate, result in less than 100% yield. Since many such circuits are quite complex and expensive, it is desirable whenever feasible to repair a defective circuit rather than discard it. Such repair techniques typically involve removal of a defective integrated circuit semiconductor chip from the rest of the circuit, including removal of the protective encapsulant typically formed over the chip. This removal is usually effected by selectively coring and peeling the encapsulant followed by mechanically scraping off the chip. While such a procedure is adequate, it is relatively slow for use in a mass production situation. In addition, there is some possibility that such removal will cause damage to areas of the circuit other than those to be repaired.

It is therefore a primary object of the invention to provide a means for removal of chips and encapsulant from a hybrid circuit which is fast, reproducible, easily automated and will not cause damage to the repair site or adjacent portions of the circuit.

SUMMARY OF THE INVENTION

These and other objects are achieved in accordance with the method and apparatus of the invention. A plurality including advantageously at least four high pressure water jet streams are directed to the area surrounding a chip to be removed. The nozzle supplying the jet streams also includes a fixture which is placed in contact with the encapsulant in order to seal off the area to which the jet streams are supplied. The jet streams penetrate the encapsulant and are deflected by the underlying ceramic substrate to the area under the chip. This results in a lifting off of the chip and the overlying encapsulant.

BRIEF DESCRIPTION OF THE DRAWING

These and other features of the invention are delineated in detail in the description to follow. In the drawing.

DETAILED DESCRIPTION OF THE INVENTION

Figure 1:
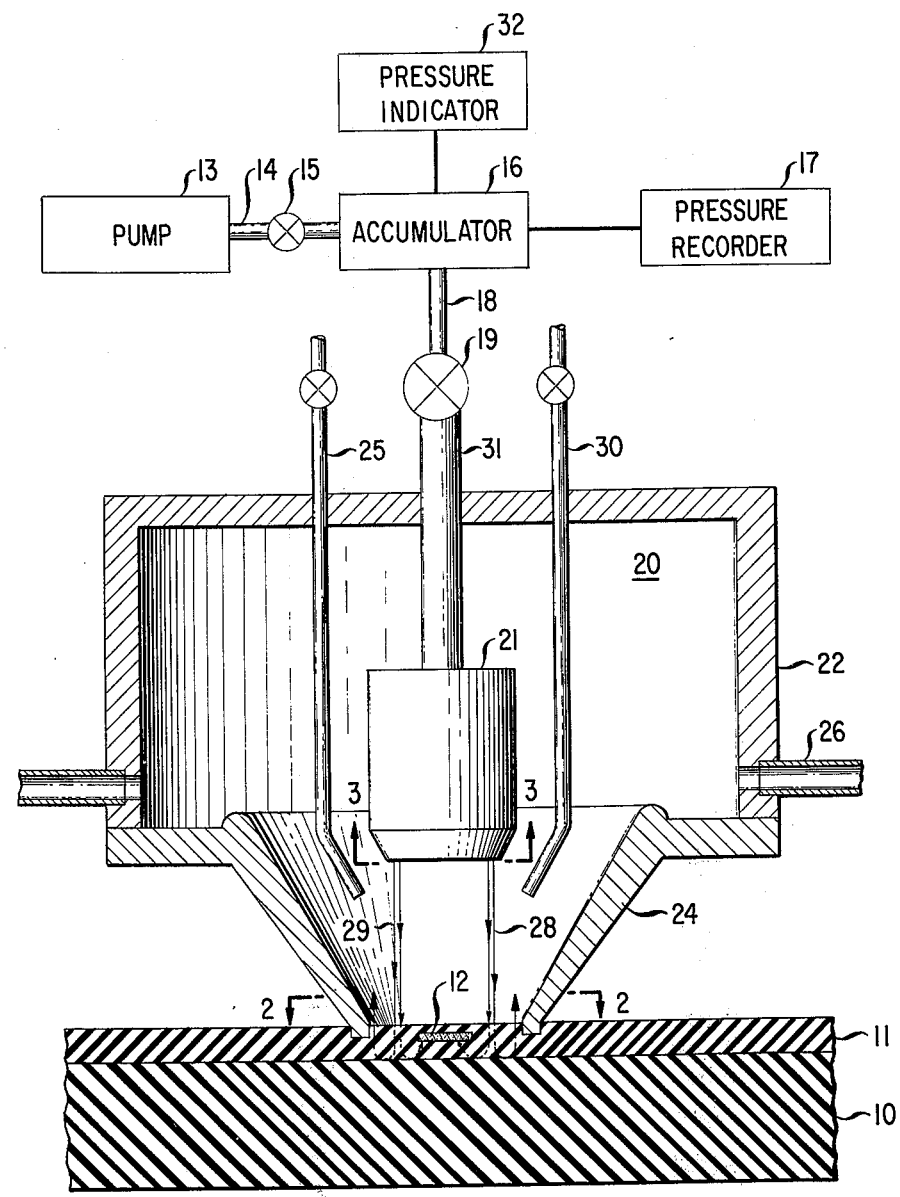
FIG. 1 is a cross-sectional, partly schematic view of the apparatus in accordance with one embodiment of the invention.

The basic features of the apparatus in accordance with one embodiment of the invention are illustrated in the partly schematic cross-sectional view of FIG. 1 along with a portion of an illustrative workpiece. The workpiece comprises a substrate, 10, usually composed of ceramic, an encapsulant 11 overlying the substrate, and the semiconductor chip 12 to be removed. The encapsulant is typically a silicone rubber such as that sold by Dow Corning Co. under the designation RTV (Room Temperature Vulcanizing), but the invention may be used with a number of encapsulants known in the art. In general, circuits encapsulated with silicone elastomers, natural rubbers or synthetic rubbers may benefit. Typically the thickness of encapsulant is within the range 6–25 mils. For the purposes of illustration, only a single chip is shown on the workpiece, but it should be clear that a number of chips, as well as thin film elements and interconnection metallization, are formed on a typical hybrid integrated circuit.

The chip is already raised slightly from the surface of the ceramic (approximately 1 mil) as the result of standard bonding procedures in fabrication of the hybrid circuit. It is not believed necessary, however, to have the chip slightly raised, since coplanar shearing forces generated by the jet streams in accordance with the invention should be sufficient to raise the chip off the substrate in any event. The leads bonding the chip to the ceramic are shown simply as lines emanating from the chip (see FIG. 2).

The apparatus itself includes a pump illustrated as block 13 which is coupled by pipe 14 including valve 15 to the accumulator illustrated as block 16. The particular pump used was a double-acting oil-hydraulic cylinder with high pressure water intensifiers mounted axially at each end and coupled to a common output. The particular type of pump is not significant as long as sufficient water pressure can be generated as described below. Valve 15 allows the pump to be isolated from the rest of the system once sufficient pressure is established in accumulator 16. The accumulator is simply a reservoir which is put into the system to tailor the discharge characteristics of the jet stream as described later. In this particular embodiment, two accumulators each with approximately 7.25 cubic inch internal volume were coupled in parallel, although only one is shown in FIG. 1. (Only one accumulator could be utilized if desired). A high pressure recording device, illustrated as block 17, was also provided in the system to obtain pressure discharge curves during the operation of the apparatus. The particular recorder was a standard spiral tube used for pressure measurement combined with a linear displacement transducer for measuring movement of the tube in response to the pressure of the system. The recording device is primarily useful as a research tool and would not necessarily be required in commercial manufacture. However, a pressure indicator, illustrated as block 32, should be included to indicate when the desired pressure is reached in the accumulator. This indicator may be a standard pressure gauge or any of a number of indicators known in the art.

Accumulator 16 is coupled by means of pipe 18 through valve 19 to nozzle assembly 20. Valve 19 was an electro-pneumatically operated valve for discharging the high pressure water built up in the accumulator. Other types of valves may be utilized for this purpose.

Figure 2:
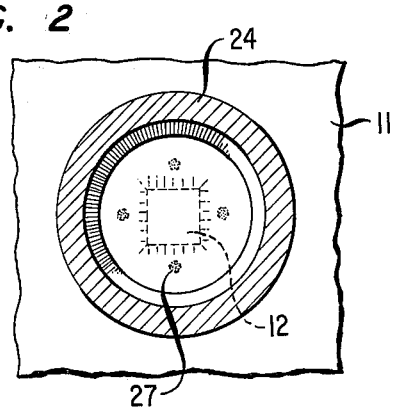
FIG. 2 is a cross-sectional view taken along line 2—2 of FIG. 1.
Figure 3:
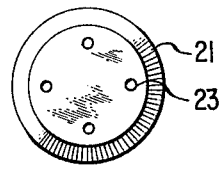
FIG. 3 is a cross-sectional view taken along line 3—3 of FIG. 1.

Pipe 18 couples the water supply to the nozzle tube 31 and nozzle head 21 which are part of nozzle assembly 20 and are illustratively made of stainless steel. One of the important features of the invention is the fact that, as shown in FIG. 3, the nozzle head supplies a plurality of jet streams through openings 23 rather than just a single jet. A constant high pressure (approximately 30,000 P.S.I.) single jet stream tends to cause damage to thin film circuitry after a few seconds of application. The preferred apparatus for the present invention provides advantageously at least four relatively large diameter jet streams operating at a relatively low pressure to obtain the desired removal in a short time. In this embodiment, therefore, the diameter of openings 23 was approximately 0.0147 inches, and a system pressure of approximately 15,000 P.S.I. was established in the accumulators. The openings were positioned in the nozzle head so that a jet stream could be directed to a portion of the workpiece adjacent to each side of the chip to be removed. This is illustrated in FIG. 2, with circles 27 illustrating the areas of the encapsulant, 11, upon which the jet streams impinge during the operation of the apparatus. The placing of the jet streams in this manner allows the chip to be removed without shattering the chip or leaving significant residue as would be the case if a single stream were utilized. The diameter of the nozzle apertures and the water pressure may of course be varied according to particular needs. It appears that the pressure should be within the range 12,000 – 20,000 P.S.I. Below this range, the pressure is usually insufficient to cause removal of the chip and above this range damage tends to be caused to the thin film conductors of the circuit. The aperture diameters should preferably be in the range 0.01 – 0.02 inches to permit enough jet stream pressure for easy chip removal while avoiding damage to the circuit.

The nozzle assembly further includes a fixture 22, which in this example was made of brass, secured to the nozzle tube 31 by means of standard fittings. The fixture includes a segment 24 in the shape of a truncated cone with an opening provided opposite the nozzle head 21 to allow passage of the jet streams therethrough. The basic function of the fixture is to define the repair site area and contain the jet stream liquid by sealing off the repair site from the rest of the circuit. This is accomplished by bringing the ends of segment 24 in contact with and compressing the encapsulant 11 prior to discharging the jet streams. (The defined area is also illustrated in FIG. 2.) A secondary function of the fixture is to secure and house the cleansing jet lines, two of which are shown as 25 and 30 in FIG. 1, which may be desirable for cleaning the area subsequent to removal of the chip as described below. The fixture further includes pipes 26 made of copper through which the waste water from the jet stream may exit the assembly 20.

In operation, the workpiece was placed atop a vacuum chuck on an x-y table (not shown) and positioned so that the chip 12 to be removed was aligned with the axial center of the nozzle assembly 20. The vacuum chuck assembly was then raised until the nozzle fixture segment 24 contacted and compressed the encapsulant 11 of the circuit as shown in FIG. 1. This operation effects a seal for the jet stream and defines the repair site. The valve 19 was closed and valve 15 opened so that the water supply was brought to the proper pressure in accumulator 16 by pump 13. When the desired pressure was reached, valve 15 was closed to isolate the pump from the rest of the system. Valve 19 was then opened to discharge the water in accumulator 16 through nozzle head 21 producing four jet streams impinging on the workpiece. Two of these jet streams are illustrated as lines 28 and 29 of FIG. 1. As illustrated, the jet streams bore through the encapsulant 11 in the areas adjacent to chip 12 and fanned out radially upon contacting the substrate 10. At least a portion of each jet stream was deflected to the area under chip 12, meeting at a point approximately centrally located between the four jet streams. The force of these streams deflected under the chip was sufficient to vertically lift off the chip 12 and the encapsulant surrounding it. The time for chip removal was less than 0.5 sec which represents a considerable time savings over the mechanical scraping approach. Further, no damage to the ceramic substrate as the result of the impinging jets could be ascertained, nor was there any damage to the hybrid integrated circuit inside or outside the repair site.

Figure 4:
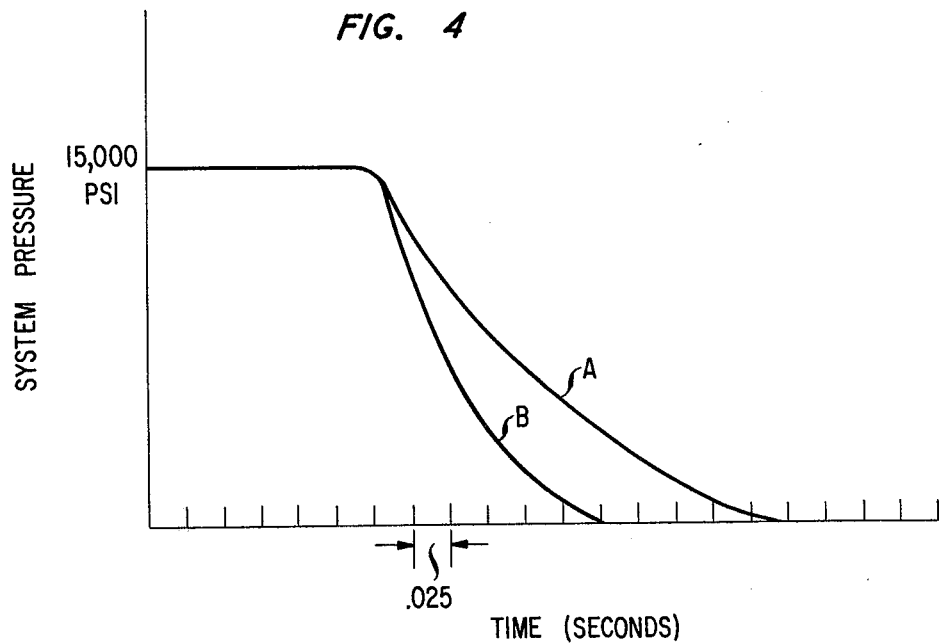
FIG. 4 is a pressure discharge curve for the apparatus in accordance with the same embodiment.
Figure 5:
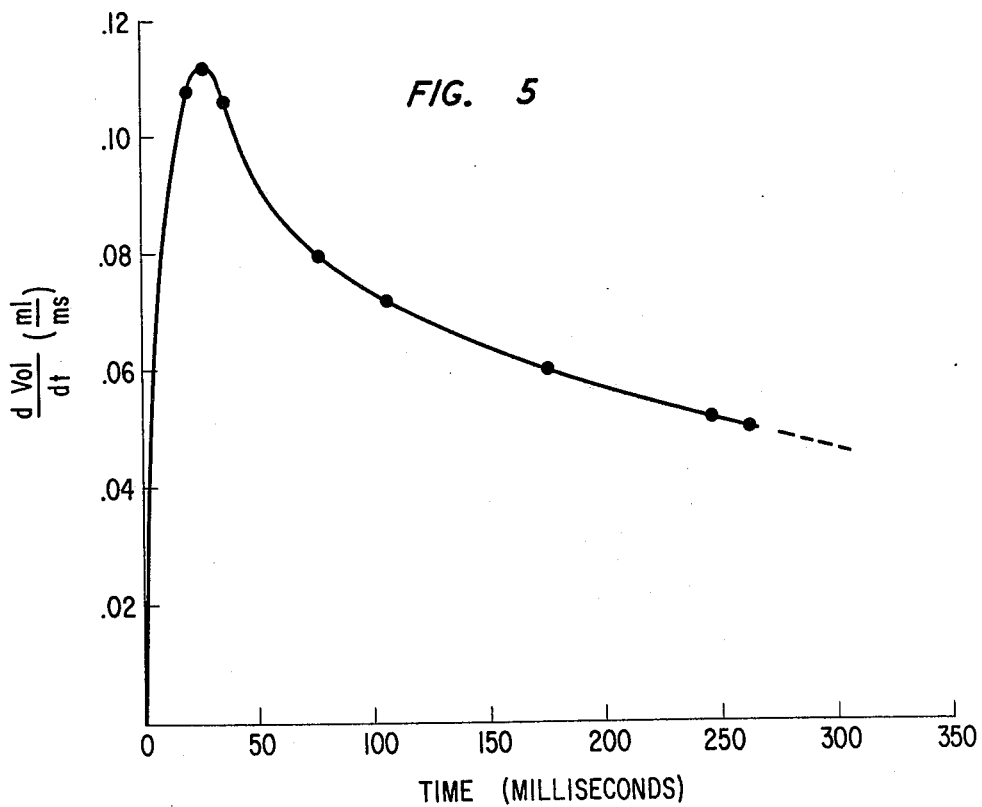
FIG. 5 is a plot of the rate of change of water volume discharged as a function of time in accordance with the same embodiment.

The pressure discharge characteristics of the system are shown in FIG. 4. As previously mentioned, the pressure in the accumulator just prior to discharge was approximately 15,000 P.S.I. Curve A shows the drop in pressure as measured by the reorder for two accumulators and curve B shows the discharge for one accumulator. The use of a larger internal system volume obtained with two accumulators is considered the more desirable embodiment due to the more gradual pressure discharge resulting from the volume compressibility of water at high pressure. The rate of change of volume of water collected as a function of time was determined for this embodiment and is plotted in FIG. 5. This graph illustrates one important feature of the invention. It will be realized that the jet stream velocity reaches a maximum in under 50 milliseconds and then tapers off. This permits the chip to be removed quickly (usually by the time the velocity reaches a maximum) and the remainder of the jet stream cleans off most encapsulant residue. This tapering off of the discharge is most conveniently achieved by use of the appropriate accumulator volume. The same effect could be accomplished by omitting the valve 15 and introducing a variable speed pump, however the embodiment utilizing pump isolation by the accumulators described herein is preferred.

A further important parameter of the system is the maximum surface pressure generated at the substrate during the discharge of the jet streams. This value was measured as approximately 7,100 P.S.I. for the embodiment described. It is believed that maximum surface pressure should be within the range 5,000 – 10,000 P.S.I. in order to lift off the chip but not cause damage to the substrate metallization.

In the particular pump utilized in this embodiment, it was necessary to utilize some water soluble oil in the water supply (approximately 99% water and 1% Mobil MET S-122) in order to lubricate intensifier seals and inhibit corrosion. It was therefore desirable to cleanse the repair site of any water soluble oil residue subsequent to chip removal. This was done by first directing a low pressure stream of iso-propyl alcohol to the repair site through jet line 25. This was followed by directing de-ionized water at the site through line 30. An air jet blast was then supplied to a third line (not shown in the figure for the sake of clarity of illustration) to remove any de-ionized water that might have remained after the wash procedure. It should be realized that the water soluble oil may not be needed depending on the type of pump employed, in which case the cleansing operation could be eliminated.

Thus, it will be realized that although the invention has described using jet streams consisting essentially of water, other ingredients may be added for particular needs. In addition, it is contemplated that liquids other than water may be used in the system provided they do not damage the substrate or the thin film circuit. For example, it may be desirable to use as the liquid a solution which dissolves the encapsulant, such as tetramethyl ammonium hydroxide, 1-methyl 2-perolidinone and iso-propyl alcohol in a ratio of 1:10:10 by volume.

It is also possible to include a fifth opening in the nozzle head 21 which would be positioned so as to direct a fifth stream to approximately the center of the chip to be removed. This stream could be used to aid cleaning out of the residue under the chip once it is removed.

It will further be clear that although the method and apparatus of the invention have primary utility in removing chips from the substrate, other applications may be found for the invention. For example, the jets might be used simply to remove just the encapsulant from certain areas of the circuit. Such an operation is significant when it is desired to re-anodize tantalum nitride thin film resistors which have been covered by the encapsulant. The method and apparatus might also be used to test metallization adhesion by determining the pressure required to remove the metal from the substrate with the jet streams.

Various additional modifications will become apparent to those skilled in the art. All such variations which basically rely on the teachings through which the invention has advanced the art are properly considered within the spirit and scope of the invention.

What is claimed is:

1. In the fabrication of circuits on a substrate, a method for removal of elements having top and bottom surfaces from said substrate comprising the steps of:
   forming a sealed region around the area adjacent to the element to be removed; and
   simultaneously directing a plurality of jet streams comprising a liquid medium at the area adjacent to the element and within said sealed region of sufficient force such that a portion of the jet streams is deflected by the substrate to a portion of the bottom surface of said element and lifts said element off the substrate.

2. The method according to claim 1 wherein the liquid medium comprises water and a water soluble oil.

3. The method according to claim 2 further comprising the steps of, subsequent to the removal of the element, sequentially directing at said area within said sealed region jets of iso-propyl alcohol, de-ionized water and air in order to clean said area.

4. The method according to claim 1 wherein the number of jet streams of said liquid is four and each of said streams is directed to a respective area adjacent to one of the sides of said element.

5. The method according to claim 1 wherein the number of jet streams is five with each of four streams directed to a respective area adjacent to one of the sides of said element and the fifth directed to approximately the center of said element.

6. The method according to claim 1 wherein the initial pressure of the liquid before being directed to said area is within the range 12,000 – 20,000 p.s.i.

7. The method according to claim 1 wherein the maximum surface pressure exerted on the substrate by said jet streams lies within the range 5,000 – 10,000 p.s.i.

8. The method according to claim 1 further comprising the step of, prior to directing said jet streams to the substrate, collecting said liquid medium in a sealed container until a desired pressure is reached.

9. In the fabrication of hybrid circuits on an insulating substrate, a method for removing integrated semiconductor circuit chips bonded to said substrate but slightly raised from the surface of said substrate and having top and bottom surfaces including an encapsulant formed over the chip and substrate comprising the steps of:
   forming a sealed region around the area adjacent to the chip to be removed by contacting the encapsulant with an annular segment of a fixture defining a volume over said chip and substrate;
   collecting a supply of a liquid consisting essentially of water in a sealed container until a pressure within the range 12,000 – 20,000 p.s.i. is reached; and
   simultaneously directing from within said volume at least four jet streams of said water supply at the area of encapsulant adjacent to said chip and within said sealed region in a direction essentially perpendicular to said substrate such that each of said streams is directed to a respective area adjacent to each side of the chip, said jet streams having sufficient force such that they bore through said encapsulant and portions of the streams are deflected by the substrate to a portion of the bottom surface of said chip in order to lift said chip and the overlying encapsulant off the substrate.

10. The method according to claim 9 further comprising the steps of, subsequent to the removal of said chip and overlying encapsulant, sequentially directing from within said volume at said area within the sealed region streams of iso-propyl alcohol, de-ionized water and air in order to clean and dry said area.

11. The method according to claim 9 wherein the number of jet streams is four and each stream is directed to a respective area adjacent to each side of the chip.

12. The method according to claim 9 wherein the number of jet streams is five with each of four streams directed to a respective area adjacent to each side of the chip and the fifth stream directed to approximately the center of the chip.

13. The method according to claim 9 wherein the maximum surface pressure exerted on the substrate by said jet streams lies within the range 5,000 – 10,000 p.s.i.

14. Apparatus for removal of elements having top and bottom surfaces from a substrate comprising:
   a nozzle head including a bottom surface defining at least four openings therein through which discrete liquid jet streams may be directed;
   a nozzle tube for coupling said liquid to said nozzle head; and
   a fixture attached to said tube and defining a volume therein including said nozzle head, said fixture defining an annular opening at a distance from said bottom surface so that said jet streams can pass through.

15. Apparatus according to claim 14 further comprising a container coupled to said nozzle tube and first valve means for controlling the passage of said liquid from said container to said tube.

16. Apparatus according to claim 15 further comprising means for supplying said liquid to said container and second valve means for isolating said container from said supply means when a desired pressure is reached in said container.

17. Apparatus according to claim 14 wherein said nozzle surface defines four openings therein arranged in a rectangular pattern.

18. Apparatus according to claim 14 wherein said nozzle surface defines four openings therein arranged in a rectangular pattern and a fifth opening at approximately the center of said rectangle.

19. Apparatus according to claim 14 wherein the diameter of the openings is within the range 0.01 – 0.02 inches.

20. Apparatus for the removal of integrated circuit chips bonded to an insulating substrate comprising:
   a nozzle head including a bottom surface defining at least four openings therein arranged in a rectangular pattern through which discrete liquid jet streams may be directed;
   a nozzle tube for coupling said liquid to said nozzle head;
   a fixture attached to said tube and defining a volume therein including said nozzle head, said fixture including a segment in the shape of a truncated cone defining an annular opening at a distance from said bottom surface so that said jet streams can pass through;
   a container coupled to said nozzle tube capable of collecting said liquid to a desired pressure and means for releasing said liquid from said container to said tube when the desired pressure is reached; and
   means for supplying said liquid to said container and means for isolating said container from said supply means when the desired pressure is reached.

* * * * *